United States Patent
Govorkov et al.

(10) Patent No.: US 8,483,249 B1
(45) Date of Patent: Jul. 9, 2013

(54) DIODE-LASER BAR PACKAGE

(75) Inventors: Sergei Govorkov, Los Altos, CA (US); John H. Jerman, Palo Alto, CA (US)

(73) Assignee: Coherent, Inc., Santa Clara, CA (US)

( * ) Notice: Subject to any disclaimer, the term of this patent is extended or adjusted under 35 U.S.C. 154(b) by 0 days.

(21) Appl. No.: 13/448,108

(22) Filed: Apr. 16, 2012

(51) Int. Cl.
*H01S 3/04* (2006.01)

(52) U.S. Cl.
USPC .................. 372/35; 372/36; 372/34

(58) Field of Classification Search
USPC ................................. 372/36, 35, 34
See application file for complete search history.

(56) References Cited

U.S. PATENT DOCUMENTS

| | | | |
|---|---|---|---|
| 5,610,930 A * | 3/1997 | Macomber et al. | 372/36 |
| 6,027,256 A | 2/2000 | Nightingale et al. | |
| 6,229,031 B1 | 5/2001 | Strohmaier et al. | |
| 6,650,668 B2 | 11/2003 | Yatskar et al. | |
| 6,960,033 B1 | 11/2005 | Acklin et al. | |
| 7,502,398 B2 | 3/2009 | Schleuning et al. | |
| 7,686,224 B2 | 3/2010 | Schleuning et al. | |
| 7,697,207 B2 | 4/2010 | Govorkov et al. | |
| 2005/0069266 A1* | 3/2005 | Kouta et al. | 385/92 |
| 2012/0257647 A1* | 10/2012 | Shu et al. | 372/36 |

OTHER PUBLICATIONS

Shu et al., U.S. Appl. No. 13/084,235, filed Apr. 11, 2011 titled, "Cooling Apparatus for Optically Pumped Semiconductor Laser", 25 pages.

* cited by examiner

*Primary Examiner* — Kinam Park
(74) *Attorney, Agent, or Firm* — Morrison & Foerster LLP

(57) ABSTRACT

A diode-laser bar package includes a diamond composite heat-sink on which is soft-solder bonded a copper-pad having an area much greater than that of the diode-laser bar. A constraining-block of a metal having a CTE matching that of the diode-laser bar is hard-solder bonded to the conductive pad. The constraining-block is configured such that the conductive pad in the region of the diode-laser bar has a CTE about equal to that of the constraining-block, and, accordingly, the diode-laser bar.

20 Claims, 5 Drawing Sheets

DIODE-LASER BAR PACKAGE

TECHNICAL FIELD OF THE INVENTION

The present invention relates in general to mounting diode-laser bars on a cooling package. The invention relates in particular to mounting diode-laser bars using a hard-solder onto a water-cooled heat-sink arrangement.

DISCUSSION OF BACKGROUND ART

The term "packaging" applied to diode-laser bars refers to mounting a diode-laser bar on some sort of cooling base or heat-sink. This base may be a relatively massive base providing a "conductively cooled package" (CCP). For higher power operation, the base may be water-cooled, for example by a micro-channel arrangement. Typically the diode-laser bar is soldered "p-side down" onto an insulating sub-mount. The sub-mount, in turn, is soldered to the heat-sink.

Packaging involves a number of compromises and trade-offs. As the materials of the bar, sub-mount, heat-sink, and solder have different thermal properties, particularly the coefficient-of-thermal-expansion (CTE), there is invariably a trade-off between thermal performance and CTE-matching (or mismatching). Indium (In) soldered bars on copper (Cu) perform well thermally, i.e., tolerate some CTE mismatch, but soft solders such as the indium solder can be unreliable. One hard solder that is essentially completely reliable is an 80:20 gold-tin (Au—Sn) solder. This solder however cannot tolerate any CTE mismatch between the soldered components.

There is a need for a diode-laser bar packaging arrangement that will provide effective CTE-matching using high thermal-conductivity materials, Preferably the packaging arrangement should be capable of being water-cooled.

SUMMARY OF THE INVENTION

The present invention is directed to diode-laser packing. One embodiment of a diode-laser bar apparatus in accordance with the present invention comprises a diode-laser having a length and a width and grown on a semiconductor substrate. The diode-laser bar is hard-solder bonded to a conductive pad. The conductive pad is soft-solder bonded to a heat-sink. The conductive pad has a length and width substantially greater than the length and width of the diode-laser bar, the diode-laser bar being bonded to the copper-pad at one edge thereof. A constraining-block is hard-solder bonded to the conductive pad. The constraining-block has a coefficient of thermal expansion (CTE) about matching that of the semiconductor substrate of the diode-laser bar. The constraining-block is configured to reduce the effective CTE of the conductive pad. Preferably, the conductive pad is constrained to have an effective CTE about matching that of the material of the constraining-block, thereby about matching that of the diode-laser bar.

In another aspect of the invention, the apparatus can be provided with a water-cooling arrangement for cooling the heat-sink. The water cooling-arrangement includes a base-block having a trough in an upper surface thereof. An input conduit is provided in the base of the trough for flowing water into the trough, and an output conduit is provided in the base of the trough for conducting the water out of the trough. A fluid seal surrounds the trough, with the heat-sink being clamped to the base-block such that the trough, the seal, and a portion of the heat-sink covering the trough form a chamber in which cooling water flows in contact with that portion of the heat-sink covering the trough.

BRIEF DESCRIPTION OF THE DRAWINGS

The accompanying drawings, which are incorporated in and constitute a part of the specification, schematically illustrate a preferred embodiment of the present invention, and together with the general description given above and the detailed description of the preferred embodiment given below, serve to explain principles of the present invention.

DETAILED DESCRIPTION OF THE INVENTION

Figure 1:
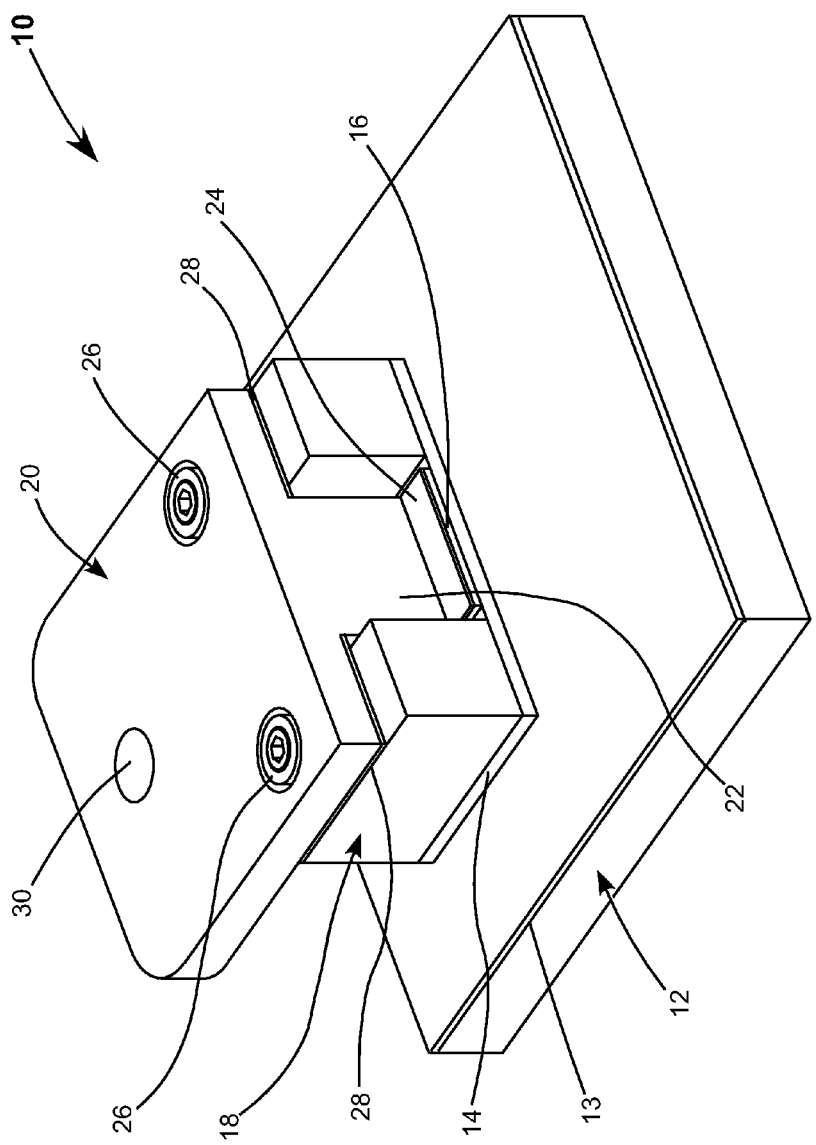
FIG. 1 is a three-dimensional view schematically illustrating one preferred embodiment of diode-laser bar package in accordance with the present invention, including a silicon-diamond heat-sink, a thin conductive pad soldered to the silicon diamond heat-sink, an invar constraining block having a cut-out portion therein and soldered to the copper-pad, a diode-laser bar soldered to the conductive pad in the cut-out portion of the invar block, and a cathode plate attached to the invar block-but electrically insulated therefrom, the cathode plate being electrically connected to the diode-laser bar by a copper shim.
Figure 2:
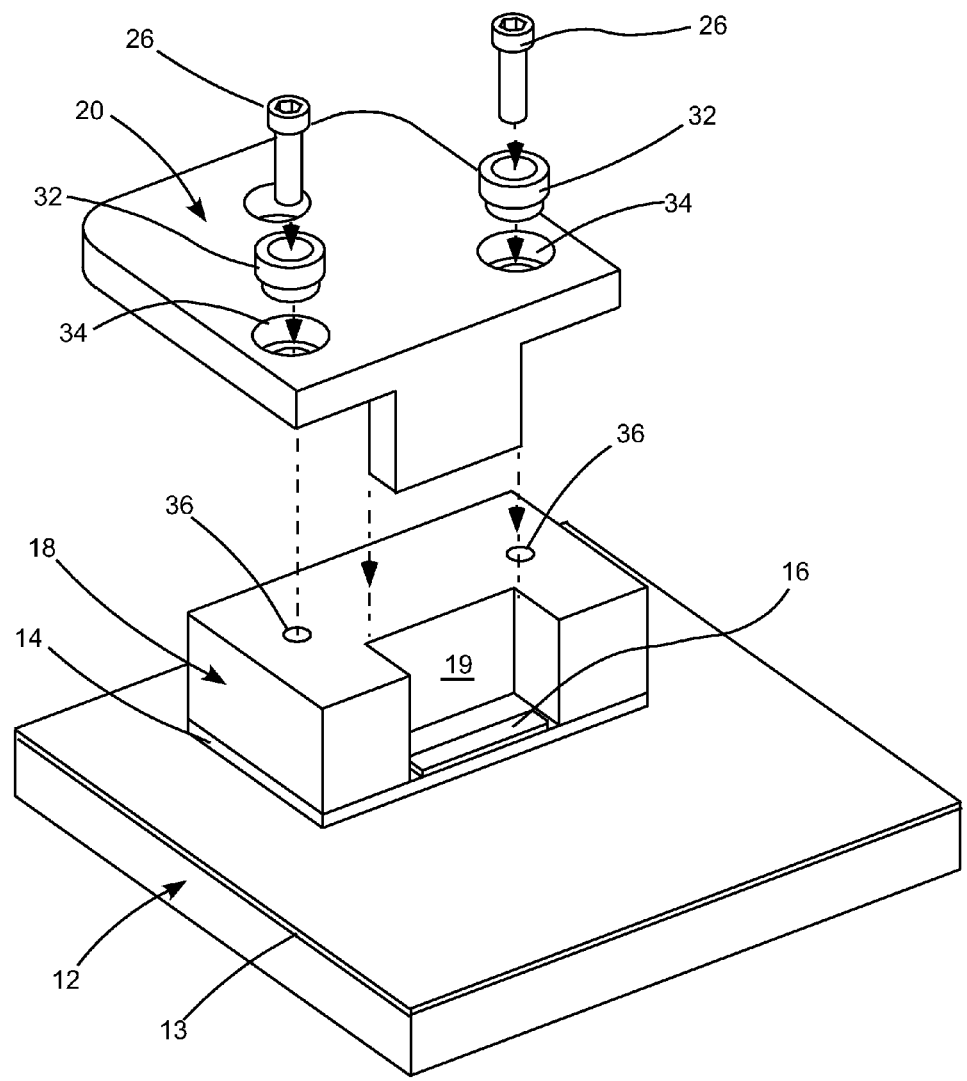
FIG. 2 is an exploded three-dimensional view schematically illustrating details of the invar block, the cathode plate, and the cathode-plate attachment arrangements in the diode-laser bar package of FIG. 1.

Referring now to the drawings, wherein like components are designated by like reference numerals, FIG. 1 schematically illustrates one preferred embodiment 10 of diode-laser bar apparatus (package) in accordance with the present invention. FIG. 2 schematically illustrates package 10 in an "exploded" form to reveal details of certain components of the package.

Package 10 is assembled on a heat-sink 12 of a material having a relatively high thermal conductivity. The terminology relatively high thermal conductivity, as used in this description and the claims appended here means having a thermal conductivity about equal to or greater than that, of copper (Cu). If not already made from an electrically insulating material, heat-sink 12 is preferably coated with a layer 13 of insulating material such as silicon carbide (SiC) to electrically isolate the diode-laser bar from the heat-sink. A preferred thickness for such a layer is between about 0.5 and about 5.0 micrometers ($\mu$m). One advantage of this is that two or more diode-laser bars could share a common heat-sink and be connected in series to limit pump current requirements. Another advantage of this electrical isolation is discussed further herein below.

A preferred material for heat-sink 12 is a diamond-composite material. Diamond composite materials comprise a matrix of diamond particles in another relatively highly thermally-conductive element. Materials such as copper, gold, and silver have been used in such diamond matrices and these have been "tailored" to have a CTE matching that of semiconductor substrate materials on which semiconductor device are epitaxially grown. These matrices are not always commercially available.

Silicon-diamond composite material is commercially available in stock thickness sheets having a thickness up to about 5 millimeters (5 mm). Silicon diamond matrices include silicon carbide which is formed by reaction between the silicon and diamond during the preparation of the matrix. One commercial supplier of diamond composite materials is Element Six B.V. of Cuijk, Netherlands. Metallization can be provided according to whatever solder is to be used to bond to the composite. If insulating layer 13 is applied, this, if course, must be done before the metallization.

Silicon diamond composite materials have a CTE less that of semiconductor materials, such as gallium arsenide (GaAs) and indium phosphide (InP) on which diode-laser structures are epitaxially grown. By way of example, silicon-diamond composite has a CTE of between about 2.5 and 3.0 parts-per-million (depending on temperature) per degree Kelvin (ppm/° K) compared with a CTE of about 6.8 ppm/° K for gallium arsenide (GaAs). GaAs is a substrate material for growing diode-lasers which emit in a wavelength range between bout 600 nm and 1100 nm.

Bonded to heat-sink 12 is a pad 14 of a highly electrically conductive metal. Preferred metals for pad include copper (Cu) and silver (Ag). Bonded to pad 14 is a diode-laser bar 16. Bonding of diode-laser bar 16 to conductive pad 14 is preferably accomplished by a hard solder such as the above-referenced Au/Sn solder. Other possible hard solders include 88/12 gold/germanium (Au/Ge) solder and 97/3 gold/silicon (Au/Si) solder.

Conductive pad 14 preferably has a thickness between about 0.25 mm and about 1.0 mm and serves to provide an anode connection for the diode-laser bar and a thermal-conductivity path to the heat-sink. The diode-laser bar is bonded with the emitting-edge thereof aligned with the front edge of the conductive pad.

Bonded to conductive pad 14 is a constraining-block 18 of a metal alloy selected to have a CTE about matching that of the semiconductor substrate material of diode-laser bar 16. Preferably the CTE of constraining-block 18 is within about ±1 ppm of the CTE of the semiconductor-substrate material. Preferred alloys for constraining-block 18 can be selected from a range of alloys commercially available under trade names INVAR and KOVAR. INVAR encompasses alloys of iron (Fe) and nickel (Ni). KOVAR encompasses alloys of Fe, Ni, and cobalt (Co).

The bonding of constraining-block 18 to conductive pad 14 is accomplished using a hard-solder that will not yield under any shear-stress resulting from a difference in CTE between the constraining-block and the conductive pad. Bonding of diode-laser bar 16 to conductive pad 14 is preferably accomplished using an above-referenced hard-solder. More preferably, the same hard solder is used for bonding diode-laser bar 16 to pad 14 and for bonding block 18 to pad 14. Both soldering steps can occur during a single reflow soldering operation.

Attached to constraining-block 18 is a cathode plate 20. A tab portion 22 of a cathode plate 20 is electrically connected to diode-laser bar 16 via a copper shim or foil 24. A soft solder may be used to make connects between the cathode plate and the shim, and between the shim and the diode-laser bar. Attachment of the cathode plate to the constraining-block is accomplished here by screws 26, which are electrically insulated from the constraining-block. An insulating foil 28, such as a plastic foil, electrically insulates the cathode plate from the constraining-block. A screw-hole 30 provides for making electric connection to the cathode plate.

The description continues with reference in particular to FIG. 2, from which insulating foil 28 and connecting shim 24 of FIG. 1 are omitted for convenience of illustration. Here, electrical insulation of screws 26 from constraining-block 18 is accomplished by inserting insulating bushings 32 into correspondingly prepared holes 34 in cathode plate 20, then inserting the screws through the bushings into threaded holes 36 in constraining-block 18.

Constraining-block 18 is massive by comparison with conductive pad 14, and has a cut out region 19 therein, giving the constraining-block a U-shape or horseshoe-shape. Diode-laser bar 16 is attached to pad 14 within cut-out region 19 of the constraining-block. Preferably, constraining-block 18 has a thickness at least about twice the thickness of pad 14, and more preferably has a thickness at least about five-times the thickness of pad 14. The actual minimum thickness will be dependent on the relative moduli and yield-strengths of the block material and pad material, the goal in general is that the block constrains the pad such that the pad effectively has the same CTE as the block.

Pad 14 and block 18 have a length at least about twice the length of the diode-laser bar with cut out region 19 of block 18 about centrally located in the block and having a length somewhat greater than the length of the diode-laser bar. The length of the pad and block here is referred to the length-direction of the diode-laser bar. The width of pad 14 and block 18 are at least about ten-times the width of the diode-laser bar. The diode-laser bar is aligned with the front edge of the pad. The pad can extend beyond the block in areas not including the edge of the pad on which the diode-laser bar is bonded.

A result of the above discussed bonding and dimensional constraints of block 18 and pad 14 is that the CTE of pad 14 at the upper-surface thereof to which diode-laser bar 18 is bonded is essentially constrained to be that of the material of block 18, which has about the CTE of the substrate material of the diode-laser bar. This provides for substantially strain-free bonding of the diode-laser bar to the conductive pad. Any CTE mismatch between pad 18 and heat-sink 12 can be accommodated by a soft-solder bonding of the pad to the heat-sink.

The above-described configuration of diode-laser bar package 10 lends itself to an innovative water-cooling arrangement, a detailed description a preferred example 38 of which is set forth below with reference to FIG. 3. In this drawing, only that part of package 10 depicted in FIG. 2 is shown for convenience of illustration.

Water-cooling arrangement 38, includes a base block 40 in an upper surface 40A of which is machined a rectangular trough 42. Here, base-block 40 has about the same area dimension as that heat-sink 12 of the diode-laser package.

Preferred lateral dimensions (defining the area) of trough 42 are dependent on the thermal conductivity of heat-sink 12. As a general guideline preferred lateral dimensions are between about five and ten times the thickness of the heat-sink. For a silicon-diamond heat-sink having a thickness of about 5.0 mm, the area of the trough is preferably at least 25×25 mm², i.e., the square of five times the thickness of heat-sink 12. At opposite ends of trough 42 are trenches 44A and 44B extending parallel to the width direction of trough 42. The area of these trenches is not included in the minimum suggested area of the trough. Trough 42 preferably has a general depth (not including the depth of the trenches) between about 0.25 mm 1.0 mm. The depth of trenches 44A and 44B is preferably between about 0.5 mm and 1.0 mm below floor of trough 52. The location of trough 42 in block 40 relative to that of diode-laser bar 16 is preferably selected such that the bar is at or towards the center of the trough.

A relatively-shallow peripheral groove 50 is machined around trough 42 and is sized to accommodate a sealing-ring 52 protruding slightly above surface 40A of base 40. Heat-sink 12 and the diode-laser bar assembly thereon is clamped to base 40 via screws 60. Screws 60 extend through washers 62 and holes 64 in the heat-sink to engage threaded holes 66 in base-block 40. Clamping the heat-sink to the base compresses the sealing ring thereby providing a sealed cavity (trough 42) below the heat-sink. It should be noted, here, that drilling holes in a very hard material such as silicon-diamond composite must usually be done by laser-drilling, which is a relatively expensive operation. A less expensive, albeit less elegant, clamping method could be as simple as using a sufficient number of C-clamps around the periphery of the heat-sink and base-block. This and any other clamping method may be used without departing from the spirit and scope of the present invention.

In operation, with trough 40 sealed to heat-sink 12 as described above, cooling fluid (water) is admitted to trench 44A via an inlet conduit 46. The trench causes the inlet water to flow (spread) across trench 44A before overflowing the trench this causes a "sheet" of water to flow along trench 40. The finite inlet pressure of the cooling water causes the flowing sheet to fill the trough, making essentially full-area contact with that portion of the heat-sink exposed to the trough. The cooling water is collected by trench 44B and channeled by that trench into an outlet conduit 48.

Figure 4:
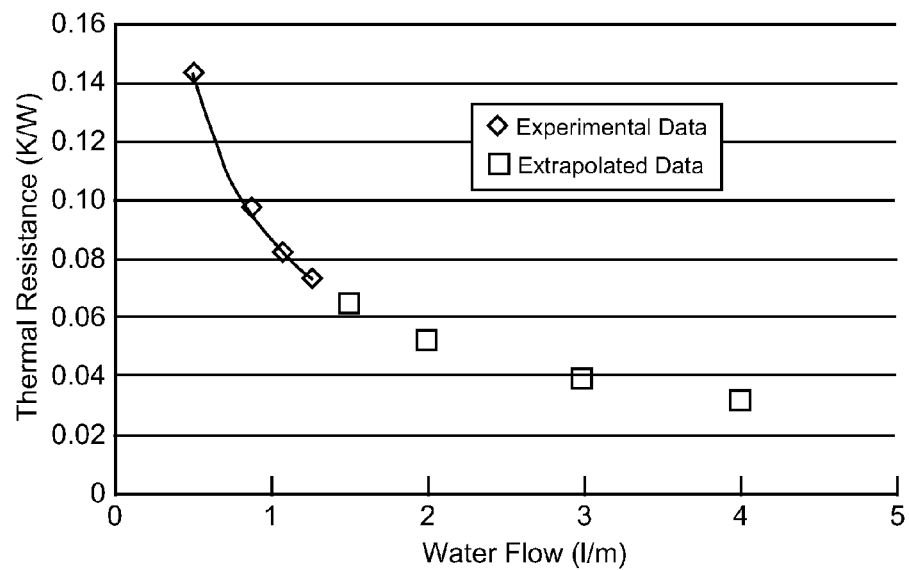
FIG. 4 is a graph schematically illustrating measured and calculated thermal resistance of a silicon-diamond heat-sink as a function of water-flow rate in one example of the water-cooling arrangement of FIG. 3.

FIG. 4 is a graph schematically illustrating measured and calculated thermal resistance as a function of water-flow rate for a silicon-diamond heat-sink backed by a 1.0 mm-deep trough having an area of about 10.0 cm². The trough has a length and width equal to 3.5 cm. Water-inlet pressure is 1.0 pounds per square-inch (psi). Experimental data points are indicated by diamonds and fit an equation:

$$y = x^{-0.735} \quad (1)$$

where y is the thermal resistance in degrees K per Watt (° K/W) and x is the flow rate in liters per minute (l/min). Data points identified by squares are extrapolated (calculated) values from equation (1). It can be seen that the thermal resistance is less than 0.05° K/W at water flow rates greater than about 3.0 l/min.

Figure 3:
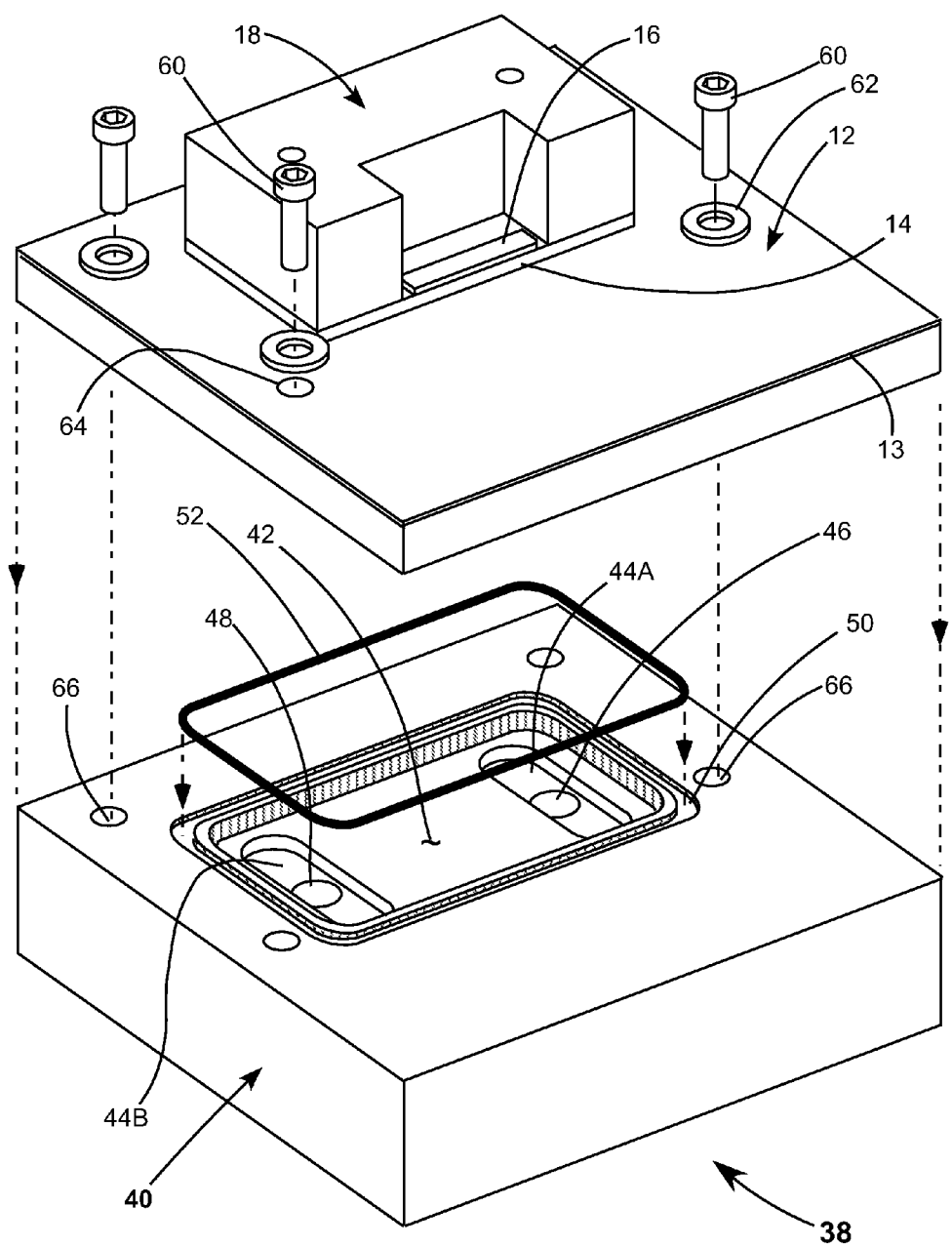
FIG. 3 is an exploded three-dimensional view schematically illustrating details of a large-contact area water-cooling arrangement for the silicon diamond heat-sink in the diode-laser bar package of FIG. 1.
Figure 5:
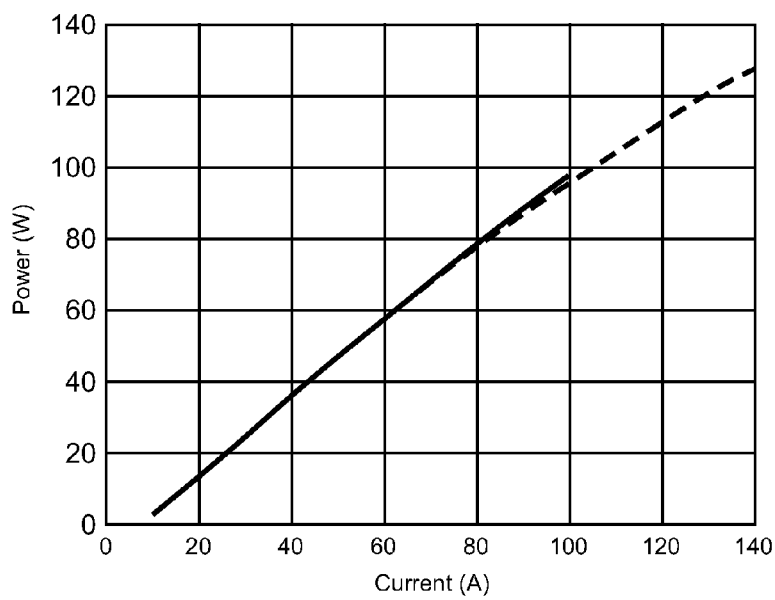
FIG. 5 is a graph schematically illustrating measured diode-laser bar output-power as a function of drive-current in an example of the diode-laser bar package of FIG. 1 having the heat-sink cooling arrangement of FIG. 3, with the performance characteristic of FIG. 4.

FIG. 5 is a graph schematically illustrating measured diode-laser bar output-power as a function of drive current for an example of the apparatus substantially as depicted in FIG. 3 with an exception that the heat-sink was edge-clamped to the water-cooling base. Curves are provided for two different set points (20° C., solid line and 25° C., dashed line) for inlet water-temperature, controlled by a chiller unit (not shown).

In this example, a diode-laser bar is 20% fill-factor bar having a length of about 1 cm and a width of about 2 mm. The diode-laser bar substrate is GaAs having a CTE of 6.8 ppm/° K. The conductive pad is formed from copper having a length of about 26.0 mm, a width of about 15.0 mm and a thickness of about 0.5 mm. Constraining-block 18 is a KOVAR block having a CTE of about 6.0 ppm/° K. Block 18 has an overall length and width the same as those of pad 14. Block 18 has a thickness (height) of about 6.0 mm. Cut-out portion 19 of the block is centrally located having a length of about 12.0 mm, and a width of about 5.0 mm. Heat-sink 12 is a silicon-diamond slab having a length and width of about 44.0 mm and a thickness of about 5.0 mm. Block 18 and diode-laser bar 16 are soldered to conductive pad 14 using 80/20 Au/Sn solder. Conductive pad 14 is soldered to the heat-sink using low-melting point (about 100° C.) bismuth (Bi) based, soft solder. Water-cooling arrangements are as discussed above with reference to FIG. 4.

In a typical prior-art conduction-cooled package with a comparable diode-laser bar configuration a CTE-matched submount, typically pump current levels roughly 100 A can be reached before the onset of thermal rollover. It can be seen that in the case of the present invention, as evidenced by the result of FIG. 5, thermal rollover onset is at a current greater than 140 A. This is attributable to the inventive full-area-contact water-cooling arrangement of FIG. 3.

In such a prior-art package such a performance can be approached by using a micro-channel-cooled heat-sink. A micro-channel heat-sink also requires the use of de-ionized water to minimize corrosion, because the cooling water is in electrical contact with the heat-sink. A micro-channel cooling arrangement, however, requires water pressure an order of magnitude higher than that required by the inventive water cooling arrangement. In the inventive arrangement, cooling water is electrically isolated because of insulating film 13 on heat-sink 12, or by making the heat-sink of an electrically insulating material. This allows the use of mains water (tap water) for the cooling. Diamond composite materials are chemically inert. Accordingly using a diamond composite heat-sink in conjunction with a base block 40 of a chemically inert material avoids corrosion in the cooling trough even with uncontrolled cooling water.

Figure 6:
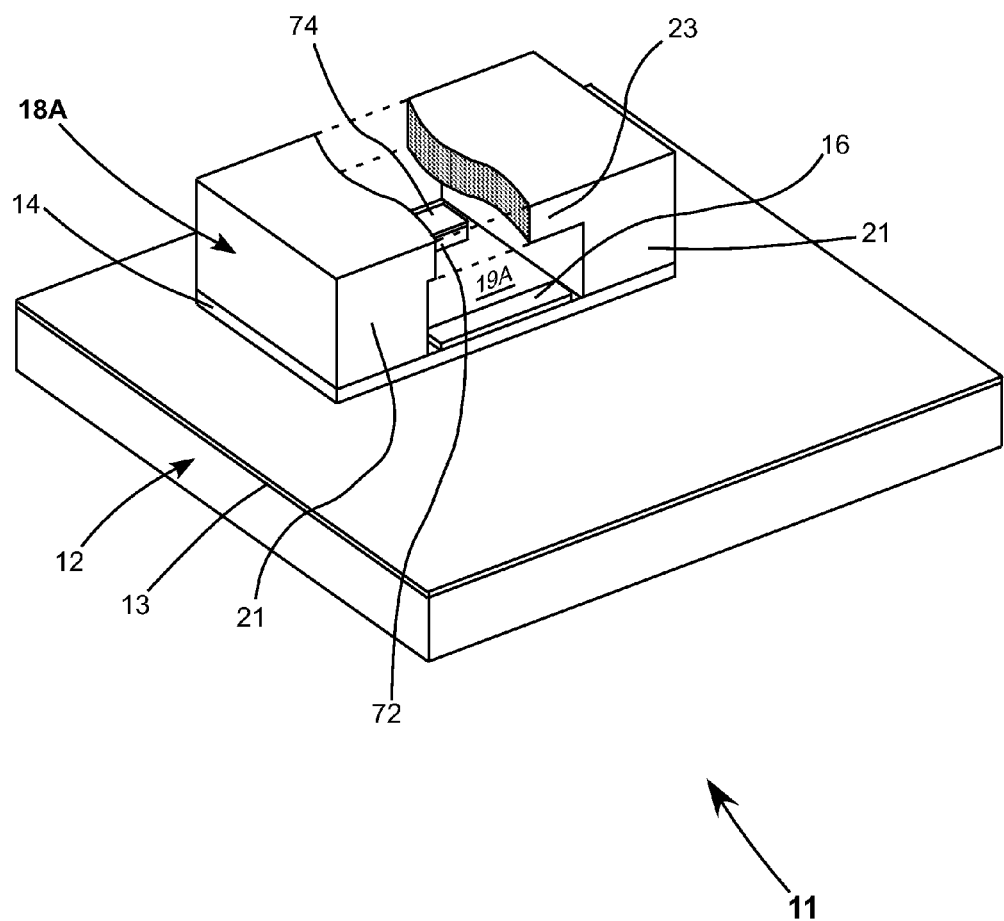
FIG. 6 is a partially cut-away, three-dimensional view schematically illustrating another preferred embodiment of apparatus in accordance with the present invention, similar to the apparatus of FIG. 1 but without the cathode plate, and with the constraining block having a different configuration.

FIG. 6 is a partially cut-away three-dimensional view schematically illustrating another embodiment 11 of diode-laser bar apparatus (package) in accordance with the present invention. This embodiment is the same in principle as embodiment of 10 FIG. 1. In embodiment 11 the constraining-block (designated block 18A in FIG. 6) is U-shaped but rotated at 90 degrees such that the cut out portion (designated 19A) in FIG. 6 extends across the width of conductive pad 14. In this configuration the block can be described as having pedestal-portions 21 joined by a bridge-portion 23. Exemplary dimensions are as discussed above for block 18 but with width and height interchanged. Package 11 can be combined with the water-cooling arrangement of FIG. 3.

In package 11 cathode plate 12 is omitted. A ceramic insulator 72 is bonded to pad 14 at the end of cut-out (tunnel) 19A opposite diode-laser bar 16. A metalized cathode contact 74 is provided on insulator 70. Contact 74 can be electrically connected to the upper (cathode) surface of diode-laser bar 16 by a copper shim (not shown) or the like.

The present invention is described above with reference to a preferred and other embodiments. The invention, however, is not limited, however, to the embodiments described and depicted herein. Rather, the invention is limited only by the claims appended hereto.

What is claimed is:

1. Diode-laser bar apparatus, comprising:
   a diode-laser bar grown on a semiconductor substrate, the diode-laser bar having a length and a width;
   a heat-sink;
   a conductive pad, soft-solder bonded to the heat-sink, the conductive pad having a length and width substantially greater than the length and width of the diode-laser bar, and the diode-laser bar being hard-solder bonded to the conductive pad at one edge thereof; and a constraining-block hard-solder bonded to the conductive pad, the constraining-block having a coefficient of thermal expansion (CTE) about matching that of the semiconductor substrate of the diode-laser bar with the constraining-block configured to reduce an effective CTE of the conductive pad.

2. The apparatus of claim 1, wherein the conductive pad has a length at least about twice the length of the diode-laser and width at least about ten-times the width of the diode-laser bar.

3. The apparatus of claim 1, wherein the heat-sink is sheet of a diamond-composite material.

4. The apparatus of claim 1, wherein the conductive pad is electrically isolated from the heat-sink.

5. The apparatus of claim 1, wherein the conductive pad is a pad of a metal selected from the group of metals consisting of copper and silver.

6. The apparatus of claim 1, wherein the constraining block is made from an alloy including iron and nickel.

7. The apparatus of claim 1, wherein the constraining block is a U-shaped block, with one side thereof bonded to the conductive pad, and wherein the diode-laser bar is bonded to the conductive pad within the U-shape of the block.

8. The apparatus of the apparatus of claim 1, wherein the constraining block is a U-shaped block having two pedestal portions spanned by a bridge portion, with pedestal portions boded to the conductive pad and the diode-laser bar bonded to the copper pad underneath the bridge portion.

9. The apparatus of claim 1, further including a water-cooling arrangement for cooling the heat-sink, the water cooling-arrangement including a base-block having a trough in an upper surface of the base-block an input conduit in the base of the trough for flowing water into the trough and output conduit in the base of the trough for conducting the water out of the trough, a fluid seal surrounding the trough, with the heat-sink being clamped to the base-block such that the trough, the seal, and a portion of the heat-sink covering the trough form a chamber in which cooling input water flows in contact with that portion of the heat-sink covering the trough.

10. The apparatus of claim 9, wherein the conductive pad is electrically isolated from the heat-sink.

11. Diode-laser bar apparatus, comprising:

a diode-laser bar grown on a gallium arsenide substrate, the diode-laser bar having a length and a width;

a heat-sink of a diamond composite material;

a conductive pad of copper or silver, soft-solder bonded to the heat-sink, the conductive pad being electrically isolated from the heat-sink and having a length and width substantially greater than the length and width of the diode-laser bar, and the diode-laser bar being hard-solder bonded to the conductive pad at one edge thereof; and a constraining-block hard-solder bonded to the conductive pad, the constraining-block being made from an alloy including iron and nickel having a coefficient of thermal expansion (CTE) about matching that of the semiconductor substrate of the diode-laser bar with the constraining-block configured to reduce an effective CTE of the conductive pad.

12. The apparatus of claim 11, wherein the hard-solder is one of a gold/tin solder, a gold/germanium solder, and a gold/silicon solder.

13. The apparatus of claim 12, wherein the soft solder is one of an indium based solder and a bismuth based solder.

14. The apparatus of claim 13 the conductive pad has a length at least about twice the length of the diode-laser and width at least about ten-times the width of the diode-laser bar.

15. The apparatus of claim 14, wherein the conductive pad has a thickness between about 0.25 millimeters and about 1.0 mm and wherein the constraining block has an overall thickness at least about twice the thickness of the conductive pad.

16. The apparatus of claim 15, wherein the CTE of the constraining block is within about 1 ppm/° K of the CTE of the gallium arsenide substrate.

17. Diode-laser bar apparatus, comprising:

a slab of a thermally conductive material having a slab thickness;

a diode-laser bar supported on the slab of thermally conductive material and electrically isolated therefrom; and a water-cooling arrangement for cooling slab, the water cooling-arrangement including a base-block having a trough in an upper surface of the base-block, an input conduit in the base of the trough for flowing water into the trough, and output conduit in the base of the trough for conducting the water out of the trough, a fluid seal surrounding the trough, with the thermally conductive slab being clamped to the base-block such that the trough, the seal, and a portion of the slab covering the trough form a chamber in which cooling input water flows from the input conduit to the output conduit in contact with that portion of the slab covering the trough.

18. The apparatus of claim 17, wherein the slab and the base block are clamped with the diode-laser located above the trough.

19. The apparatus of claim 18, wherein the trough has depth between about 0.25 mm and about 1.0 mm.

20. The apparatus of claim 19, wherein the trough has an area equal to or greater than about the square of five-times the slab thickness.

* * * * *